US012658906B2

(12) United States Patent
Das et al.

(10) Patent No.: US 12,658,906 B2
(45) Date of Patent: Jun. 16, 2026

(54) ELECTRICAL OUTPUT STAGES SUITABLE FOR HIGH-VOLTAGE OPERATION, AND ASSOCIATED METHODS

(71) Applicant: Analog Devices International Unlimited Company, Limerick (IE)

(72) Inventors: Ayan Das, Kolkata (IN); Gerard Mora-Puchalt, Catarroja (ES); Jesús Bonache Martínez, Valencia (ES); Reha Kepenek, Istanbul (TR)

(73) Assignee: Analog Devices International Unlimited Company, Limerick (IE)

( * ) Notice: Subject to any disclaimer, the term of this patent is extended or adjusted under 35 U.S.C. 154(b) by 2 days.

(21) Appl. No.: 18/755,995

(22) Filed: Jun. 27, 2024

(65) Prior Publication Data

US 2026/0005686 A1 Jan. 1, 2026

(51) Int. Cl.
    *H03K 17/06*     (2006.01)
    *H03K 17/10*     (2006.01)
    *H03K 17/16*     (2006.01)
(52) U.S. Cl.
    CPC ......... *H03K 17/063* (2013.01); *H03K 17/102* (2013.01); *H03K 17/162* (2013.01)

(58) Field of Classification Search
CPC ... H03K 17/063; H03K 17/102; H03K 17/162
See application file for complete search history.

(56) References Cited

U.S. PATENT DOCUMENTS

| | | | |
|---|---|---|---|
| 2015/0008972 A1* | 1/2015 | Solomko .......... | H03K 17/04206 |
| | | | 327/376 |
| 2024/0186882 A1* | 6/2024 | Paladugu ............ | H02M 1/0054 |

* cited by examiner

*Primary Examiner* — Metasebia T Retebo
(74) *Attorney, Agent, or Firm* — ArentFox Schiff LLP

(57) ABSTRACT

An electrical output stage suitable for high-voltage operation, including a first MOSFET, a second MOSFET, a first switching device, a second switching device, and reverse bias circuitry. The first and second MOSFETs are electrically coupled in series between a power rail and an output node. The first switching device is configured to control a gate-to-source voltage of the first MOSFET, and the second switching device is configured to control a gate-to-source voltage of the second MOSFET. The reverse bias circuitry is configured to bias a source of the second MOSFET such that a gate of the second MOSFET is reversed biased with respect to the source of the second MOSFET, when each of the first MOSFET and the second MOSFET is in its respective off-state.

20 Claims, 14 Drawing Sheets

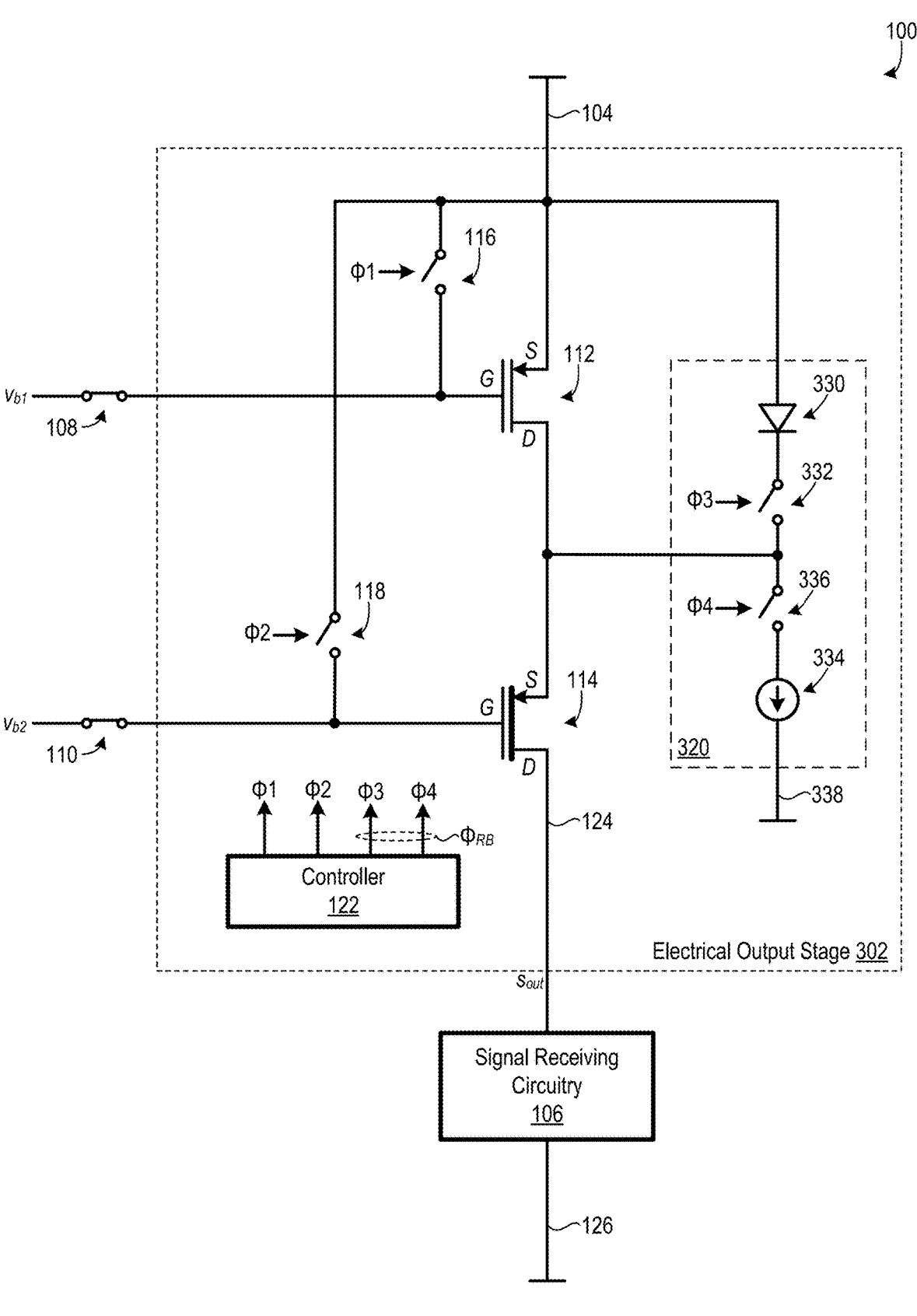
_FIG. 3_

ELECTRICAL OUTPUT STAGES SUITABLE FOR HIGH-VOLTAGE OPERATION, AND ASSOCIATED METHODS

BACKGROUND

Electrical circuits commonly include an electrical output stage configured to electrically buffer, level shift, and/or amplify, an input signal, such as for use in driving a load based on the input signal. For example, an electrical output stage configured as an amplifier may be used to amplify an input signal to enable the input signal to adequately drive a load. Electrical output stages are required to operate at high voltages in some applications.

BRIEF DESCRIPTION OF THE DRAWINGS

FIG. 3 is a schematic diagram of the FIG. 1 electrical environment illustrating details of one example embodiment of the electrical output stage, where the electrical output stage includes a diode configured as a voltage-drop device.

DETAILED DESCRIPTION OF THE EMBODIMENTS

An electrical output stage used in a high-voltage application typically includes a high-voltage transistor at an output node of the electrical output stage, to enable the electrical output stage to withstand high-voltage applied to its output node. The high-voltage transistor, though, typically exhibits significant leakage current when the transistor is in its high-impedance state, and leakage current is undesirable because it degrades system performance by altering off-state biasing conditions. Leakage current is conventionally mitigated by adding a high-voltage switch to the output node, such that an output signal flows through the high-voltage switch as well as through the high-voltage transistor. While inclusion of a high-voltage switch in an electrical output stage reduces leakage current, it has its own significant drawbacks. For example, a high-voltage switch typically exhibits non-linear behavior when the switch is in its on-state, which distorts an output signal traveling through the high voltage switch. As another example, it is desirable for a high-voltage switch to have a small size, have a low on-resistance, and exhibit low leakage current. However, resistance increases with decreasing high-voltage switch size while leakage current increases with increasing high-voltage switch size. As such, it is not feasible to optimize a high-voltage switch for each of small size, low on-resistance, and low leakage current. Instead, a designer of a high-voltage switch must compromise on one or more of the aforementioned parameters.

Disclosed herein are new electrical output stages that are suitable for high-voltage operation and at least partially overcome the above-discussed drawbacks of conventional electrical output stages. The new electrical output stages include first and second enhancement mode, metal oxide semiconductor field effect transistors (MOSFETs) electrically coupled in series between a power rail and an output node, where the first MOSFET may have a low voltage rating and the second MOSFET has a relatively high voltage rating. The new electrical output stages further include reverse bias circuitry configured to bias a source of the second MOSFET such that a gate of the second MOSFET is reversed biased with respect to the source of the second MOSFET, when each of the first MOSFET and the second MOSFET is in its respective off-state, thereby mitigating leakage current that would otherwise flow through the second MOSFET when it is in its off-state. As such, particular embodiments of the new electrical output stages advantageously do not require a high-voltage switch at their output node, thereby eliminating the above-discussed drawbacks associated with including a high-voltage switch at an output of an electrical output stage.

Figure 1:
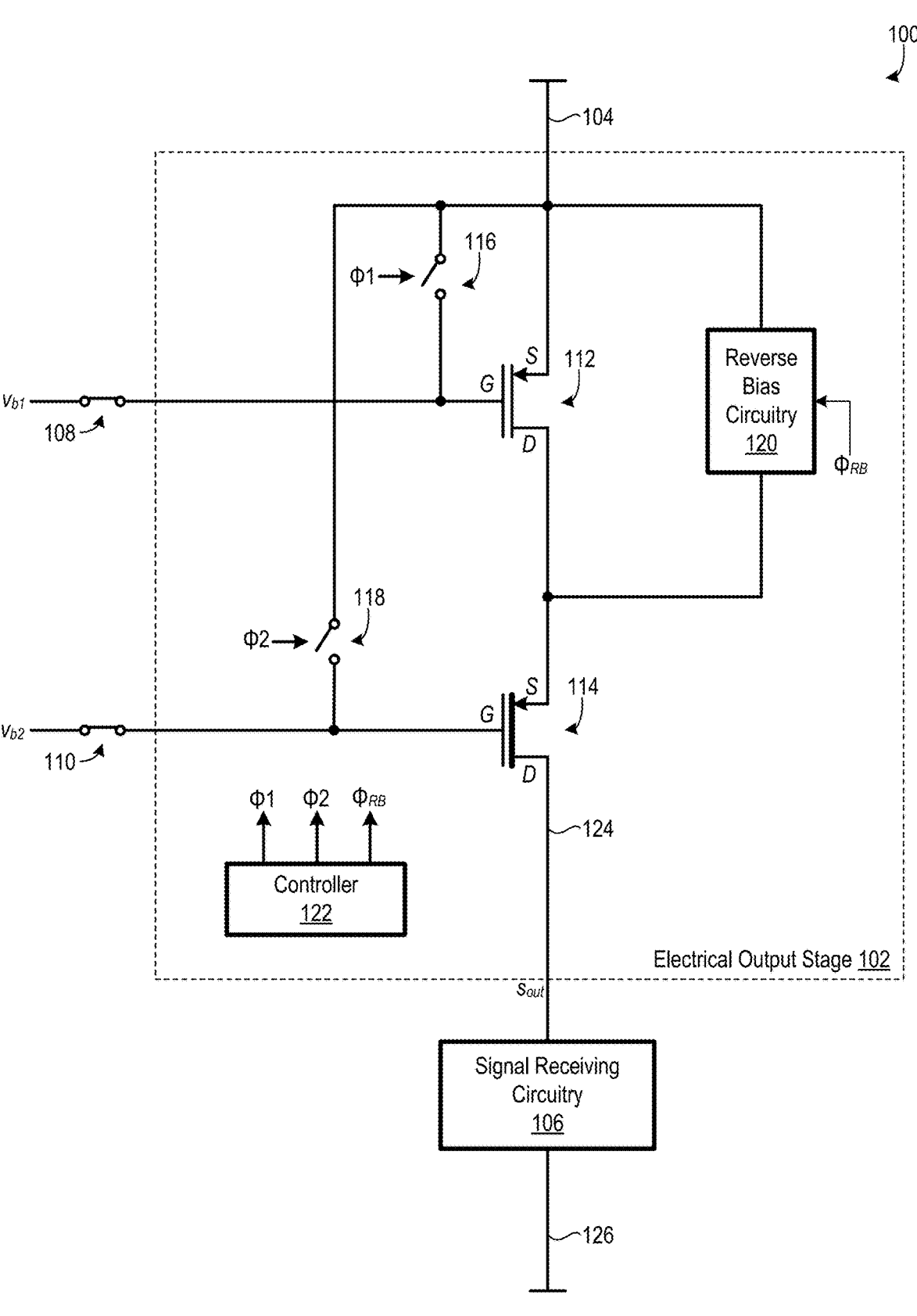
FIG. 1 is a schematic diagram of an electrical environment including an electrical output stage suitable for high voltage operation, according to an embodiment.

FIG. 1 is a schematic diagram of an electrical environment 100 including an electrical output stage 102, where electrical output stage 102 is one embodiment of the new electrical output stages disclosed herein. Electrical environment 100 further includes a power rail 104, signal receiving circuitry 106, a switching device 108, a switching device 110, and a power rail 126. Electrical environment 100 could include additional elements without departing from the scope hereof, including, but not limited to, the additional elements discussed below with respect to FIGS. 13 and 14. Electrical output stage 102 includes a first MOSFET 112, a second MOSFET 114, a first switching device 116, a second switching device 118, reverse bias circuitry 120, and a controller 122. Electrical output stage 102 could include one or more additional elements without departing from the scope hereof. Additionally, electrical output stage 102 could be modified so that controller 122 is partially or fully external to electrical output stage 102. For example, controller 122 could alternately be implemented by circuitry (not shown) that is external to electrical output stage 102, where the circuitry optionally performs functions in addition to controlling electrical output stage 102. In some alternate embodiments, controller 122 is further configured to control switching devices 108 and 110 via respective control signals (not shown) generated by controller 122.

Each of first MOSFET 112 and second MOSFET 114 is a respective P-channel MOSFET including a respective drain D, a respective source S, and a respective gate G. First MOSFET 112 and second MOSFET 114 are electrically coupled in series between power rail 104 and an output node 124. Specifically, source S of first MOSFET 112 is electrically coupled to power rail 104, drain D of first MOSFET 112 is electrically coupled to source S of second MOSFET 114, and drain D of second MOSFET 114 is electrically coupled to output node 124. Second MOSFET 114 is a high-voltage device relative to first MOSFET 112, e.g., a source-to-drain voltage rating of second MOSFET 114 is greater than a source-to-drain voltage rating of first MOSFET 112. Electrical output stage 102 could include one or more additional elements (not shown) electrically coupled in series with first MOSFET 112 and second MOSFET 114 between power rail 104 and output node 124. For example, in an embodiment of electrical output stage 102 configured to support a current multiplier, such as discussed below with respect to FIG. 14, electrical output stage 102 further includes a resistor electrically coupled between power rail 104 and source S of first MOSFET 112, such that source S of first MOSFET 112 is electrically coupled to power rail 104 via the resistor.

First switching device 116 is electrically coupled between gate G of first MOSFET 112 and power rail 104, and first switching device 116 is controlled by a control signal $\phi 1$ generated by controller 122, to enable first MOSFET 112 to be switched between a respective on-state and a respective off-state under the control of controller 122. Similarly, second switching device 118 is electrically coupled between gate G of second MOSFET 114 and power rail 104, and second switching device 118 is controlled by a control signal $\phi 2$ generated by controller 122, to enable second MOSFET 144 to be switched between a respective on-state and a respective off-state under the control of controller 122. Gate G of first MOSFET 112 is electrically coupled to a first bias signal $v_{b1}$ via switching device 108, and gate G of second MOSFET 114 is electrically coupled to a second bias signal $v_{b2}$ via switching device 110. Reverse bias circuitry 120 is illustrated in FIG. 1 as being electrically coupled to each of power rail 104 and source S of second MOSFET 114, although in some embodiments, such as discussed below with respect to FIG. 6, reverse bias circuitry 120 is not necessarily electrically coupled to power rail 104. Reverse bias circuitry 120 is controlled by one or more control signals $\phi_{RB}$ generated by controller 122. Signal receiving circuitry 106 is electrically coupled between output node 124 and power rail 126. Power rail 104 is at a higher electrical potential than power rail 126. For example, in some embodiments, power rail 104 is a positive power rail and power rail 126 is a negative power rail. In certain embodiments, power rail 126 is referenced to ground.

Electrical output stage 102 may operate in either an on-state or an off-state. The on-state, which is illustrated in FIG. 1, is characterized by (i) each of switching device 108 and switching device 110 being in its respective on-state, (ii) controller 122 generating controls signal $\phi 1$ to cause switching device 116 to operate in its respective off-state, (iii) controller 122 generating control signal $\phi 2$ to cause switching device 118 to operate in its respective off-state, and (iv) controller 122 generating control signals $\phi_{RB}$ to cause reverse bias circuitry 120 to operate in its disabled operating state. In this document, a switching device operates its off-state when the switching device is being controlled to operate in its non-conductive state, and the switching device operates in its on-state when the switching device is being controlled to operate it its conductive state. The fact that switching devices 116 and 118 operate in their respective off-states when electrical output stage 102 is in its on-state causes first MOSFET 112 and second MOSFET 114 to be controlled by first bias signal $v_{b1}$ and second bias signal $v_{b2}$, respectively, in the on-state of electrical output stage 102. While not required, it is anticipated that (i) first bias signal $v_{b1}$ will typically be an input signal for buffering, level-shifting, and/or amplifying, by electrical output stage 102, and (ii) second bias signal $v_{b2}$ will be a signal sufficient to cause second MOSFET 114 to operate in its on-state. Under these conditions, an output signal $s_{out}$ provided to signal receiving circuitry 106 via output node 124 will be a function of first bias signal $v_{b1}$, such as an amplified, level-shifted, and/or buffered, version of first bias signal $v_{b1}$. Output signal $s_{out}$ could be voltage on output node 124 and/or current flowing to signal receiving circuitry 106 via output node 124. Signal receiving circuitry 106 is any circuitry that receives output signal $s_{out}$. For example, signal receiving circuitry 106 could be a load powered by output signal $s_{out}$, a device controlled by output signal $s_{out}$, a device that further processes output signal $s_{out}$ (e.g., an analog-to-digital converter or a signal processor), etc.

Reverse bias circuitry 120 does not affect operation of electrical output stage 102 when electrical output stage 102 is in its on-state. For example, as discussed below, in some embodiments, reverse bias circuitry 120 includes switching devices that selectively couple reverse bias circuitry to source S of second MOSFET 114, and these switching devices are in their respective off-states when electrical output stage 102 is in its on-state, such that reverse bias circuitry 120 is disconnected from source S of second MOSFET 114 (and from drain D of first MOSFET 112) when electrical output stage 102 is in its on-state.

Figure 2:
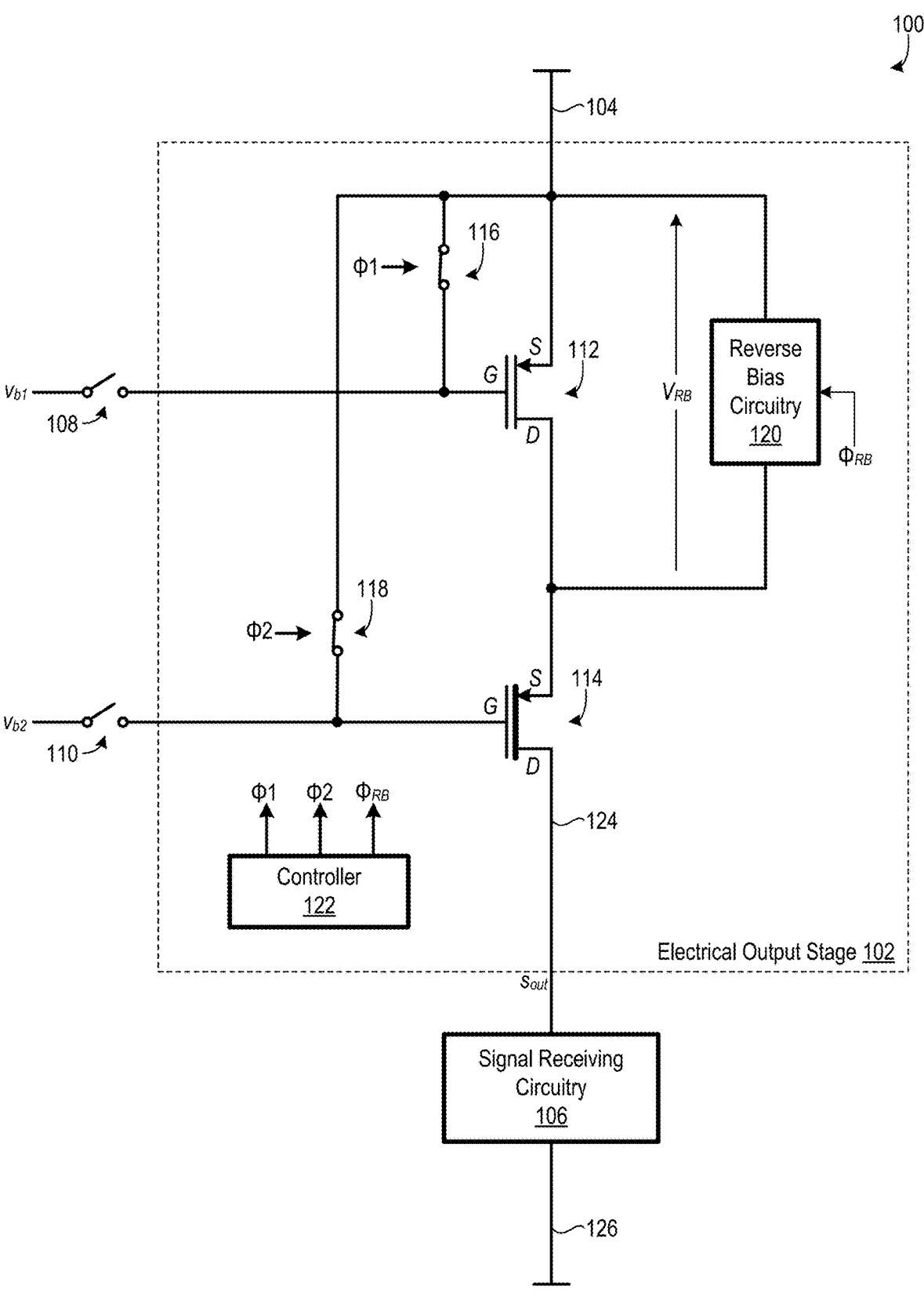
FIG. 2 is a schematic diagram of the FIG. 1 electrical environment where the electrical output stage is operating in its off-state.

FIG. 2 illustrates operation of electrical output stage 102 in its off-state, which is characterized by (i) each of switching device 108 and switching device 110 being in its respective off-state, (ii) controller 122 generating controls signal $\phi 1$ to cause switching device 116 to operate in its respective on-state, (iii) controller 122 generating control signal $\phi 2$ to cause switching device 118 to operate in its respective on-state, and (iv) controller 122 generating control signals $\phi_{RB}$ to cause reverse bias circuitry 120 to operate in its enabled operating state. The fact that switching device 116 is in its on-state causes first MOSFET 112 to have a gate-to-source voltage of essentially zero, and first MOSFET 112 therefore operates in its respective off-state. Reverse bias circuitry 120 causes a voltage $V_{RB}$ to be generated between source S of second MOSFET 114 and power rail 104, and reverse bias circuitry 120 thereby biases source S of second MOSFET 614 such that a voltage at source S of second MOSFET 114 is equal to $V_{104} - V_{RB}$, where $V_{104}$ is voltage of power rail 104. A voltage at gate G of second MOSFET 114, in contrast, is equal to voltage $V_{104}$ because switching device 118 is in its on-state. Therefore, a voltage at source S of second MOSFET 114 is less than a voltage at gate G of second MOSFET 114. As such, gate G of second MOSFET 114 is reversed bias with respect to source S of second MOSFET 114, which for a P-channel MOSFET, is characterized by gate-to-source voltage being positive. Reverse biasing gate G of second MOSFET 114 with respect to source S of second MOSFET 114 advantageously helps minimize leakage current flowing through second MOSFET 114 during the off-state of electrical output stage 102, thereby eliminating the need for a high-voltage switch for mitigating leakage current.

FIG. 3 is a schematic diagram of electrical environment 100 where electrical output stage 102 is embodied by an electrical output stage 302 including reverse bias circuitry 320. Reverse bias circuitry 320 is one possible embodiment of reverse bias circuitry 120 of FIG. 1. Reverse bias circuitry 320 includes a diode 330, a switching device 332, a current source 334, and a switching device 336. Diode 330 and switching device 332 are electrically coupled in series between power rail 104 and source S of second MOSFET 114, and current source 334 and switching device 336 are electrically coupled in series between source S of second MOSFET 114 and an additional electrical node 338. Additional electrical node 338 is, for example, power rail 126 or another power rail. Control signals $\phi_{RB}$ generated by controller 122 in electrical output stage 302 include a control signal $\phi 3$ and a control signal $\phi 4$. Controller 122 controls switching device 332 via control signal $\phi 3$, and controller 122 controls switching device 336 via control signal $\phi 4$, in electrical output stage 302.

Controller 122 controls switching devices 332 and 336 to operate in synchronicity with switching devices 116 and 118. Specifically, controller 122 causes switching devices 332 and 336 to operate in their respective off-states when switching devices 116 and 118 operate in their respective off-states, and controller 122 causes switching devices 332 and 336 to operate in their respective on-states when switching devices 116 and 118 operate in their respective on-states. Accordingly, controller 122 causes switching devices 332 and 336 to operate in their respective off-states when electrical output stage 302 is in its on-state, and controller 122 causes switching devices 332 and 336 to operate in their on-states when electrical output stage 102 is in its off-state. FIG. 3 illustrates electrical output stage 302 operating in its on-state, and switching devices 332 and 336 are therefore in their respective off-states. Consequently, reverse bias circuitry 320 is in its disabled operating state and does not affect operation of electrical output stage 302, in the illustration of FIG. 3.

Figure 4:
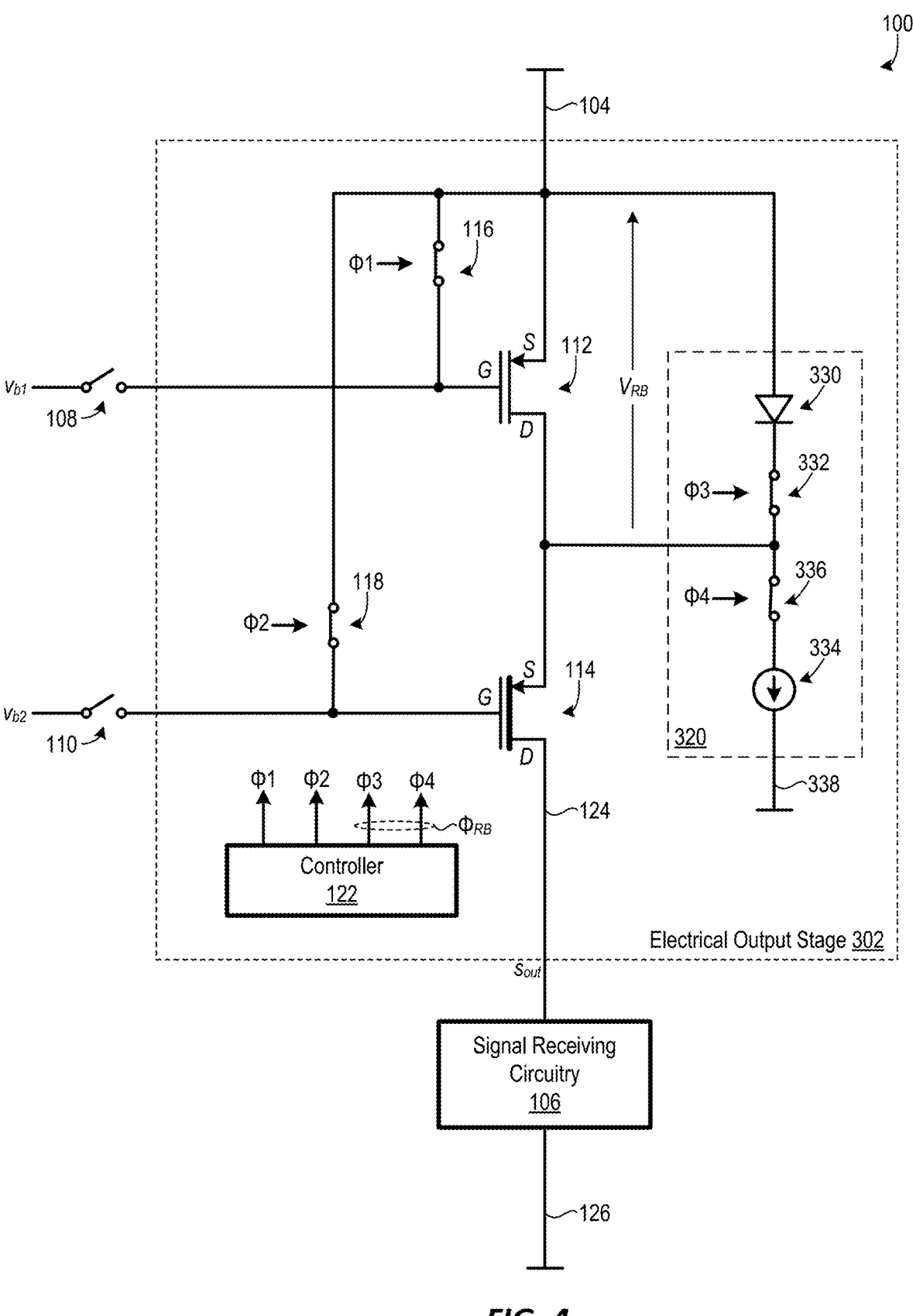
FIG. 4 is a schematic diagram of the FIG. 1 electrical environment including the FIG. 3 electrical output stage operating in its off-state.

FIG. 4, on other hand, illustrates electrical output stage 302 operating in its off-state. Accordingly, each of switching devices 332 and 336 is in its respective on-state. As such, current source 334 pulls an electric current though diode 330, where diode 330 serves as a voltage-drop device and exhibits a diode voltage drop, such as between 0.6 volt to 0.7 volt. Consequently, magnitude of voltage $V_{RB}$ is equal to voltage across diode 330, and gate-to-source voltage of second MOSFET 114 is approximately positive 0.6 volt to 0.7 volt when electrical output stage 302 is in its off-state, thereby helping minimize magnitude of leakage current flowing through second MOSFET 114.

Figure 5:
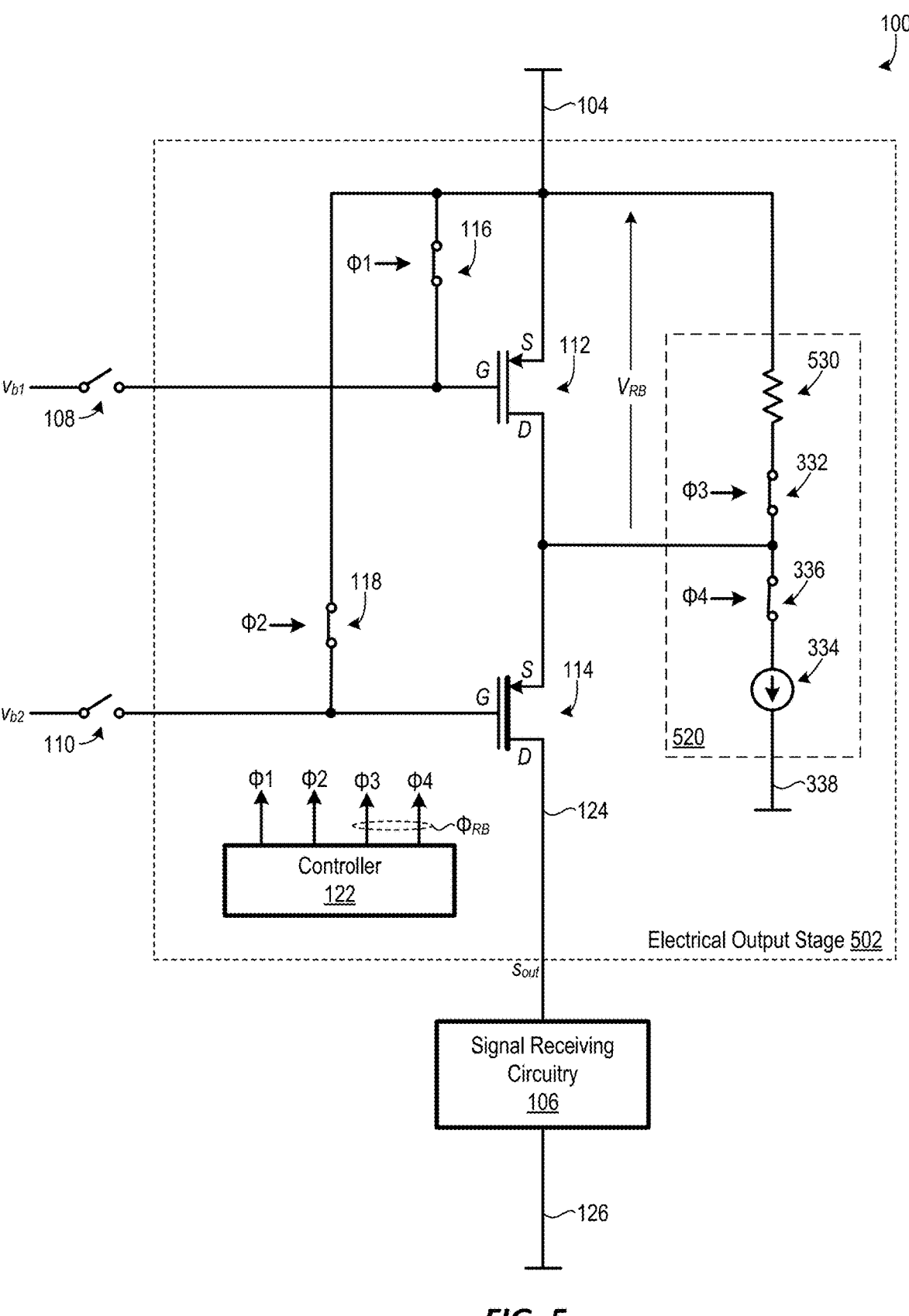
FIG. 5 is a schematic diagram of the FIG. 1 electrical environment illustrating details of another example embodiment of the electrical output stage, where the electrical output stage includes a resistor configured as a voltage-drop device.

Modifications to reverse bias circuitry 320 are possible. For example, the respective topological locations of diode 330 and switching device 332 could be swapped. As another example, diode 330 could be replaced with another type of voltage-drop device, such as a resistor, transistor, etc., that exhibits a voltage drop in response to current from current source 334. For instance, FIG. 5 is a schematic diagram of electrical environment 100 including an electrical output stage 502, which is embodiment of electrical output stage 102 including reverse bias circuitry 520. Reverse bias circuitry 520 is another embodiment of reverse bias circuitry 120, and reverse bias circuitry 520 differs from reverse bias circuitry 320 (FIG. 3) in that diode 330 is replaced with a resistor 530. FIG. 5 illustrates electrical output stage 502 operating in its off-state, and switching devices 332 and 336 are accordingly in their respective on-states. Consequently, current source 334 pulls an electric current through resistor 530, thereby creating a voltage drop across resistor 530. Therefore, magnitude of voltage $V_{RB}$ is equal to a product of (i) resistance of resistor 530 and (ii) magnitude of electric current pulled through resistor 530 by current source 334. Operation of electrical output stage 502 in its on-state is not illustrated herein, but it is understood that controller 122 causes each switching device 116, 118, 332, and 336 to operate in its respective off-state when electrical output stage 502 operates in its on-state.

Figure 6:
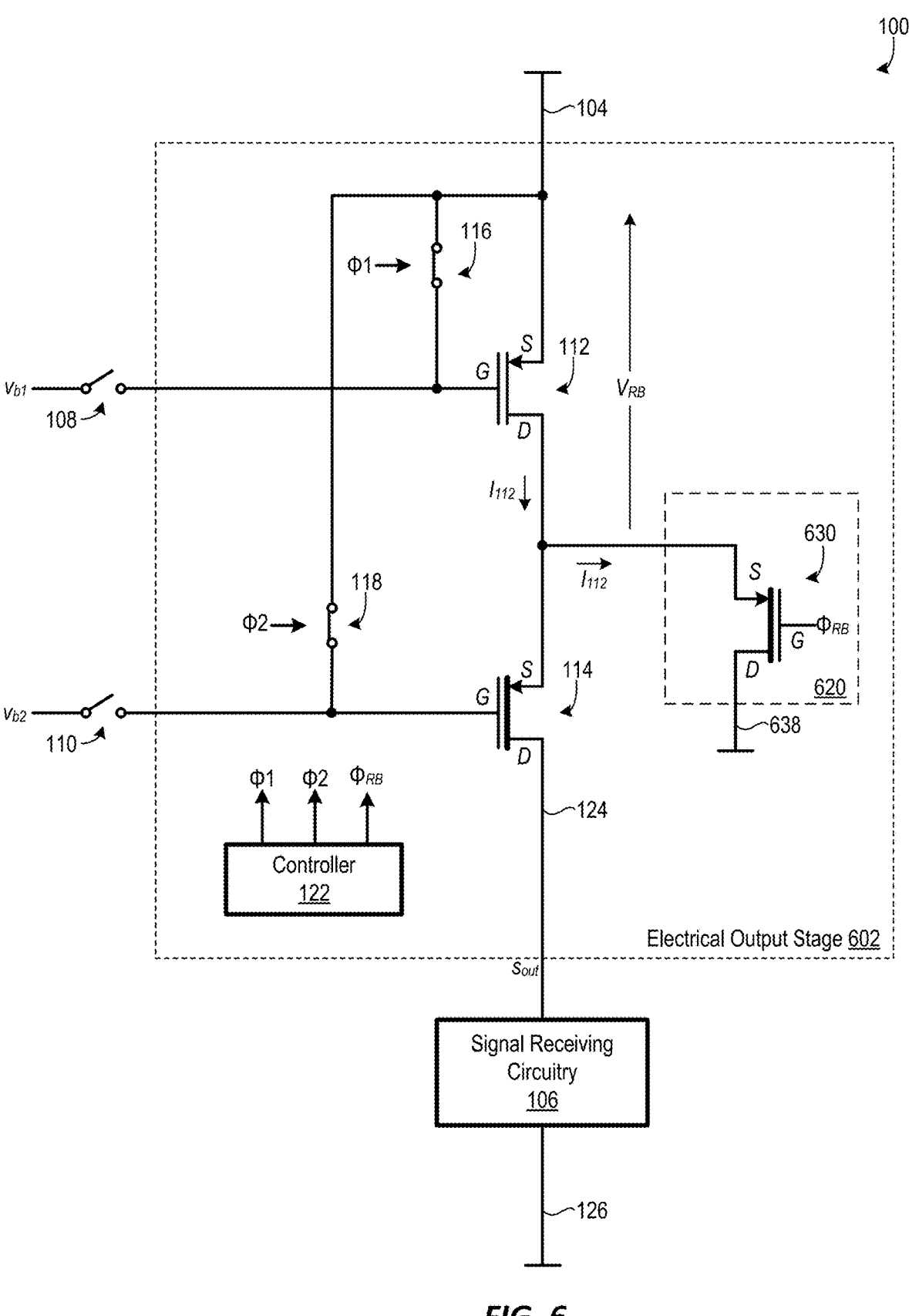
FIG. 6 is a schematic diagram of the FIG. 1 electrical environment illustrating details of an additional example embodiment of the electrical output stage, where the electrical output stage includes a transistor configured to provide a path for leakage current.

Referring again to FIGS. 1 and 2, reverse bias circuitry 120 could also be configured to provide a path for leakage current flowing through first MOSFET 112 when electrical output stage 102 is operating in its off-state, to generate voltage $V_{RB}$ between source S of second MOSFET 114 and power rail 104. For example, FIG. 6 is a schematic diagram of electrical environment 100 where electrical output stage 102 is embodied by an electrical output stage 602 including reverse bias circuitry 620. Reverse bias circuitry 620 is another possible embodiment of reverse bias circuitry 120 of FIG. 1. Reverse bias circuitry 620 includes a P-channel MOSFET 630 where (i) a source S of MOSFET 630 is electrically coupled to source S of second MOSFET 114, a drain D of MOSFET 630 is electrically coupled to an additional electrical node 638, and a gate G of MOSFET 630 is controlled by control signal $\phi_{RB}$ generated by controller 122. Additional electrical node 638 is, for example, power rail 126 or another power rail. A voltage of additional electrical node 638 is less than voltage $V_{104}$ of power rail 104. FIG. 6 illustrates electrical output stage 602 operating in its off-state, and controller 122 generates control signal $\phi_{RB}$ when electrical output stage 602 is in its off-state in a manner which causes MOSFET 630 to operate in its on-state. Consequently, MOSFET 630 provides a path for leakage current $I_{112}$ flowing through first MOSFET 112, and magnitude of voltage $V_{RB}$ is equal to a product of (i) off-state resistance of first MOSFET 112 and (ii) magnitude of leakage current $I_{112}$. Operation of electrical output stage 602 in its on-state is not illustrated herein, but it is understood that controller 122 generates control signal $\phi_{RB}$ to cause MOSFET 630 to operate in its off-state when electrical output stage 602 is in its on-state. MOSFET 630 could be replaced with another type of transistor, or with a switching device other than a transistor. For example, MOSFET 630 could be replaced with an N-channel MOSFET if controller 122 is configured to provide a positive gate-to-source voltage for controlling the N-channel MOSFET.

Figure 7:
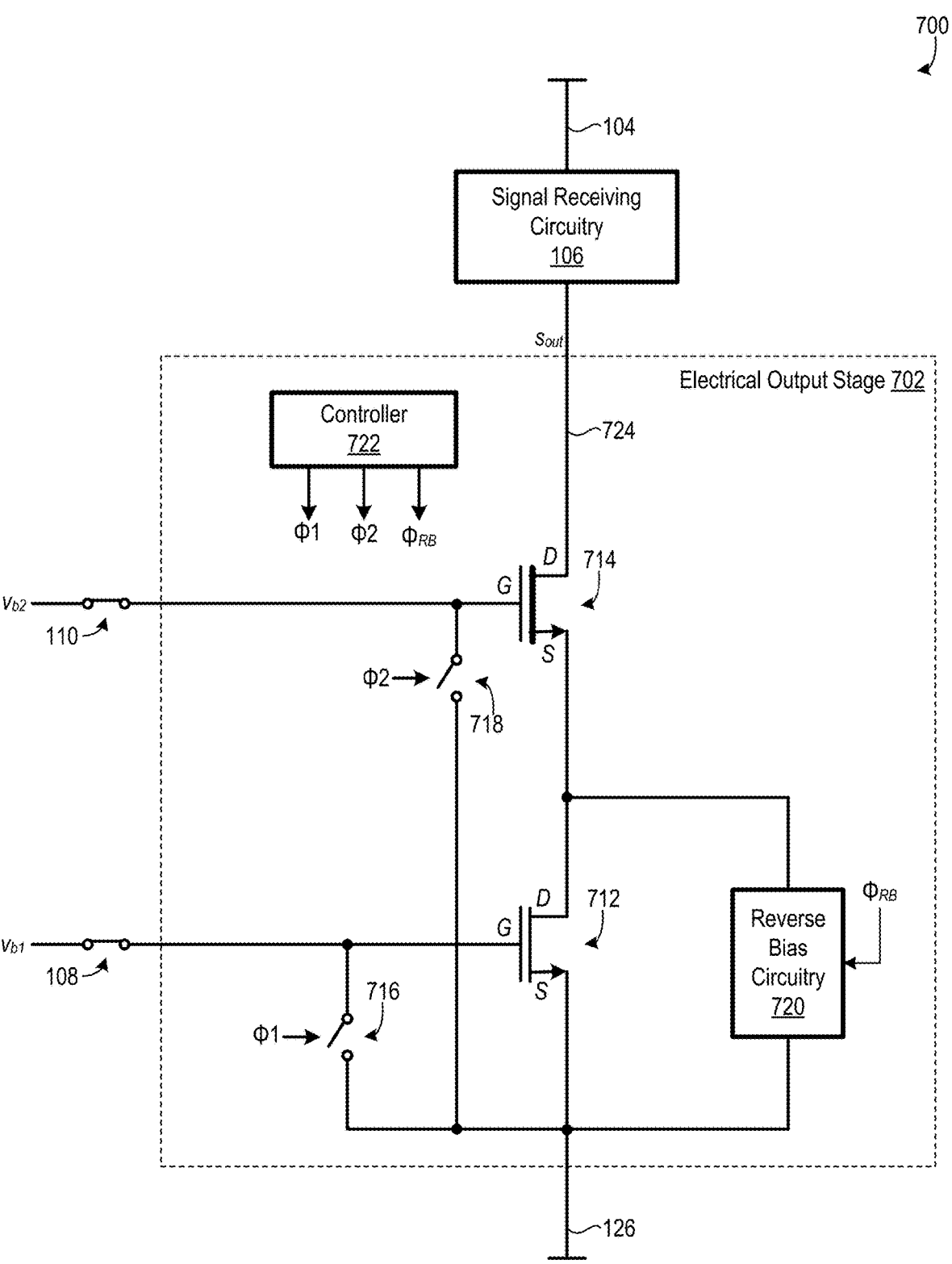
FIG. 7 is a schematic diagram of an electrical environment including another electrical output stage suitable for high voltage operation, according to an embodiment.

FIG. 7 is a schematic diagram of an electrical environment 700, which is similar to electrical environment 100 of FIG. 1, but includes an electrical output stage 702 in place of electrical output stage 102. Electrical output stage 702 is another embodiment of the new electrical output stages disclosed herein. Electrical output stage 702 includes a first MOSFET 712, a second MOSFET 714, a first switching device 716, a second switching device 718, reverse bias circuitry 720, and a controller 722. Electrical output stage 702 could include one or more additional elements without departing from the scope hereof. Additionally, electrical output stage 702 could be modified so that controller 722 is partially or fully external to electrical output stage 702. For example, controller 722 could alternately be implemented by circuitry (not shown) that is external to electrical output stage 702, where the circuitry optionally performs functions in addition to controlling electrical output stage 702. In some alternate embodiments, controller 722 is further configured to control switching devices 108 and 110 via respective control signals (not shown) generated by controller 722.

Each of first MOSFET 712 and second MOSFET 714 is a respective N-channel MOSFET including a respective drain D, a respective source S, and a respective gate G. First MOSFET 712 and second MOSFET 714 are electrically coupled in series between power rail 126 and an output node 724. Specifically, source S of first MOSFET 712 is electrically coupled to power rail 126, drain D of first MOSFET 712 is electrically coupled to source S of second MOSFET 714, and drain D of second MOSFET 714 is electrically coupled to an output node 724. Second MOSFET 714 is a high-voltage device relative to first MOSFET 712, e.g., a drain-to-source voltage rating of second MOSFET 714 is greater than a drain-to-source voltage rating of first MOS-FET 712. Electrical output stage 702 could include one or more additional elements (not shown) electrically coupled in series with first MOSFET 712 and second MOSFET 714 between power rail 126 and output node 724.

First switching device 716 is electrically coupled between gate G of first MOSFET 712 and power rail 126, and first switching device 716 is controlled by a control signal φ1 generated by controller 722, to enable first MOSFET 712 to be switched between a respective on-state and a respective off-state under the controller of controller 722. Similarly, second switching device 718 is electrically coupled between gate G of second MOSFET 714 and power rail 126, and second switching device 718 is controlled by a control signal φ2 generated by controller 722, to enable second MOSFET 714 to be switched between a respective on-state and a respective off-state under the controller of controller 722. Gate G of first MOSFET 712 is electrically coupled to first bias signal $v_{b1}$ via switching device 108, and gate G of second MOSFET 714 is electrically coupled to a second bias signal $v_{b2}$ via switching device 110. Reverse bias circuitry 720 is illustrated in FIG. 7 as being electrically coupled to each of power rail 126 and source S of second MOSFET 714, although in some embodiments, such as discussed below with respect to FIG. 12, reverse bias circuitry 720 is not necessarily electrically coupled to power rail 126. Reverse bias circuitry 720 is controlled by one or more control signals $φ_{RB}$ generated by controller 722. Signal receiving circuitry 106 is electrically coupled between output node 724 and power rail 104. As discussed above with respect to FIG. 1, power rail 104 is at a higher electrical potential than power rail 126.

Similar to electrical output stage 102 discussed above, electrical output stage 702 may operate in either an on-state or an off-state. The on-state, which is illustrated in FIG. 7, is characterized by (i) each of switching device 108 and switching device 110 being in its respective on-state, (ii) controller 722 generating controls signal φ1 to cause switching device 716 to operate in its respective off-state, (iii) controller 722 generating control signal φ2 to cause switching device 718 to operate in its respective off-state, and (iv) controller 722 generating control signals ORB to cause reverse bias circuitry 720 to operate in its disabled operating state. The fact that switching devices 716 and 718 operate in their respective off-states when electrical output stage 702 is in its on-state causes first MOSFET 712 and second MOS-FET 714 to be controlled by first bias signal $v_{b1}$ and second bias signal $v_{b2}$, respectively, in the on-state of electrical output stage 702. While not required, it is anticipated that (i) first bias signal $v_{b1}$ will typically be an input signal for buffering, level-shifting, and/or amplifying, by electrical output stage 702, and (ii) second bias signal $v_{b2}$ will be signal sufficient to cause second MOSFET 714 to operate in its on-state. Under these conditions, an output signal $s_{out}$ provided to signal receiving circuitry 106 via output node 724 will be a function of first bias signal $v_{b1}$, such as an amplified, level-shifted, and/or buffered, version of first bias signal $v_{b1}$. Output signal $s_{out}$ could be voltage on output node 724 and/or current flowing to signal receiving circuitry 106 via output node 724.

Reverse bias circuitry 720 does not affect operation of electrical output stage 702 when electrical output stage 702 is in its on-state. For example, as discussed below, in some embodiments, reverse bias circuitry 720 includes switching devices that selectively couple reverse bias circuitry to source S of second MOSFET 714, and these switching devices are in their respective off-states when electrical output stage 702 is in its on-state, such that reverse bias circuitry 720 is disconnected from source S of second MOSFET 714 (and from drain D of first MOSFET 712) when electrical output stage 702 is in its on-state.

Figure 8:
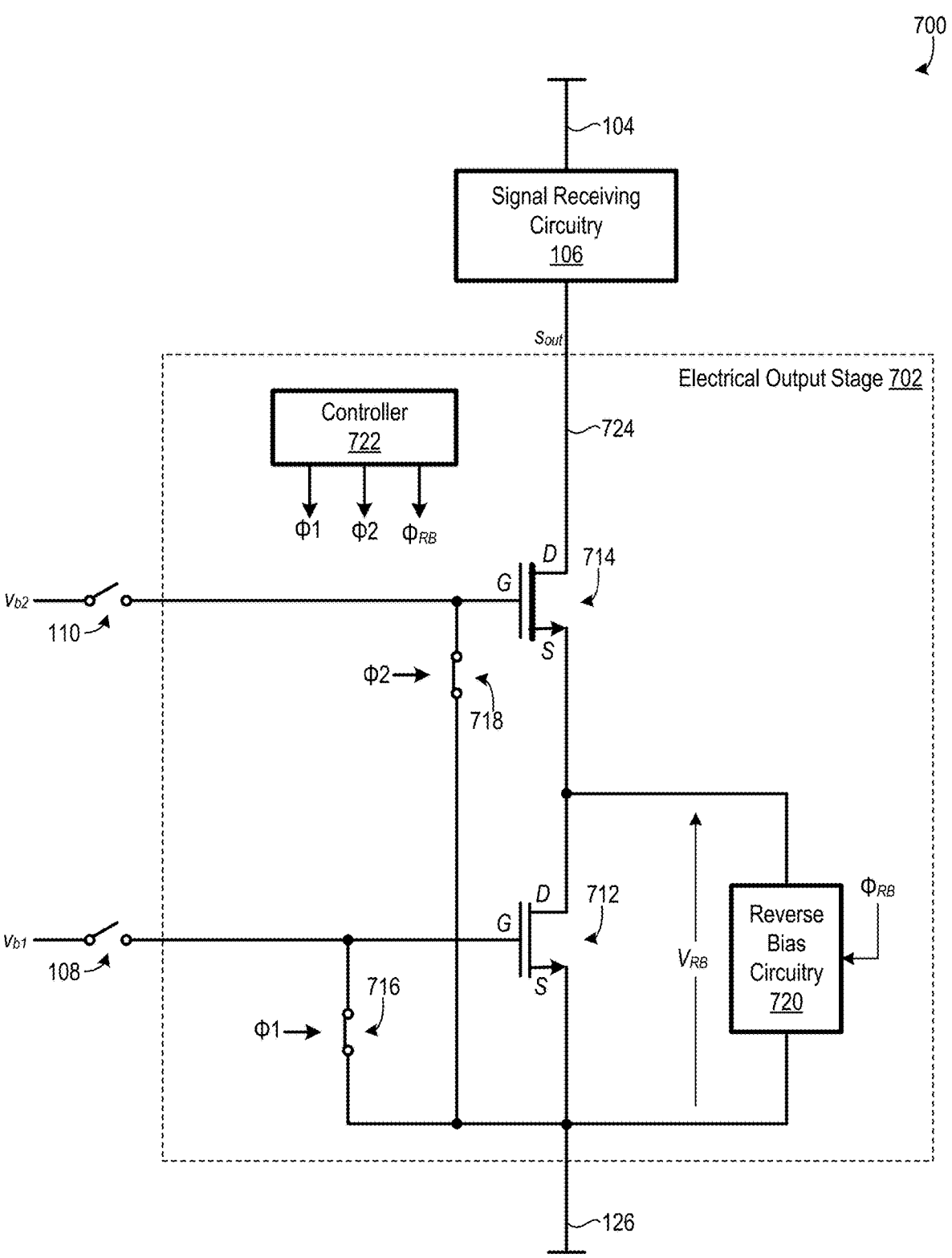
FIG. 8 is a schematic diagram of the FIG. 7 electrical environment where the electrical output stage is operating in its off-state.

FIG. 8 illustrates operation of electrical output stage 702 in its off-state, which is characterized by (i) each of switching device 108 and switching device 110 being in its respective off-state, (ii) controller 722 generating controls signal φ1 to cause switching device 716 to operate in its respective on-state, (iii) controller 722 generating control signal φ2 to cause switching device 718 to operate in its respective on-state, and (iv) controller 722 generating control signals $φ_{RB}$ to cause reverse bias circuitry 720 to operate in its enabled operating state. The fact that switching device 716 is in its on-state causes first MOSFET 712 to have a gate-to-source voltage of essentially zero, and first MOS-FET 712 therefore operates in its respective off-state. Reverse bias circuitry 720 causes a voltage $V_{RB}$ to be generated between source S of second MOSFET 714 and power rail 126, and reverse bias circuitry 720 thereby biases source S of second MOSFET 714 such that a voltage at source S of second MOSFET 714 that is equal to $V_{126}+V_{RB}$, where $V_{126}$ is a voltage of power rail 126. A voltage at gate G of second MOSFET 714, in contrast, is equal to voltage $V_{126}$ because switching device 718 is in its on-state. Therefore, a voltage at source S of second MOSFET 714 is greater than a voltage at gate G of second MOSFET 714. As such, gate G of second MOSFET 714 is reversed bias with respect to source S of second MOSFET 714, which for an N-channel MOSFET, is characterized by gate-to-source voltage being negative. Reverse biasing gate G of second MOSFET 714 with respect to source S of second MOSFET 714 advantageously helps minimize leakage current flowing through second MOSFET 714 during the off-state of electrical output stage 702, thereby eliminating the need for a high-voltage switch for mitigating leakage current.

Figure 9:
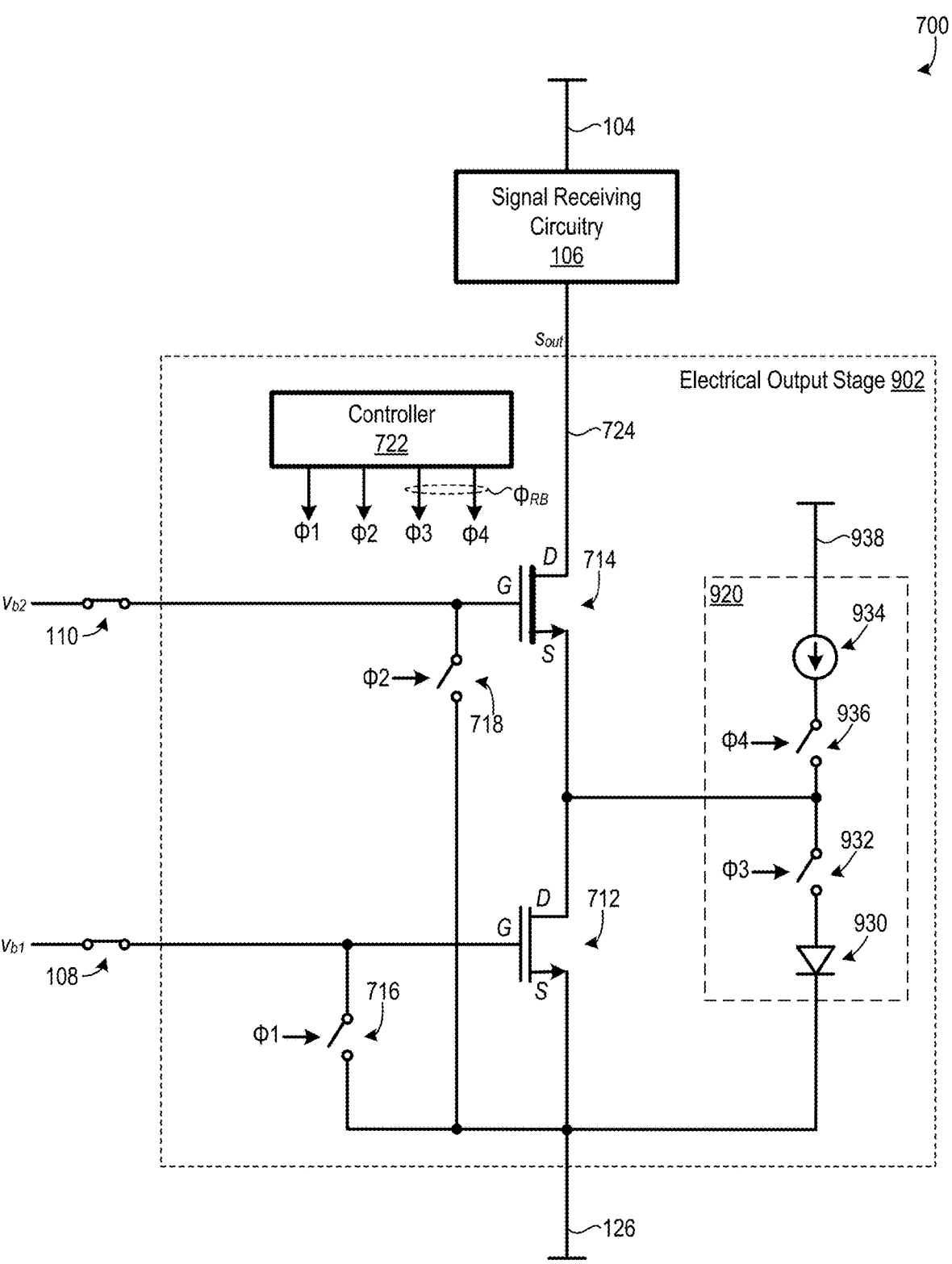
FIG. 9 is a schematic diagram of the FIG. 7 electrical environment illustrating details of one example embodiment of the electrical output stage, where the electrical output stage includes a diode configured as a voltage-drop device.

FIG. 9 is a schematic diagram of electrical environment 700 where electrical output stage 702 is embodied by an electrical output stage 902 including reverse bias circuitry 920. Reverse bias circuitry 920 is one possible embodiment of reverse bias circuitry 720 of FIG. 7. Reverse bias circuitry 920 includes a diode 930, a switching device 932, a current source 934, and a switching device 936. Diode 930 and switching device 932 are electrically coupled in series between power rail 126 and source S of second MOSFET 714, and current source 934 and switching device 936 are electrically coupled in series between source S of second MOSFET 714 and an additional electrical node 938. Additional electrical node 938 is, for example, power rail 104 or another power rail. Control signals $\phi_{RB}$ generated by controller 722 in electrical output stage 902 include a control signal $\phi 3$ and a control signal $\phi 4$. Controller 722 controls switching device 932 via control signal $\phi 3$, and controller 722 controls switching device 936 via control signal $\phi 4$, in electrical output stage 902.

Controller 722 controls switching devices 932 and 936 to operate in synchronicity with switching devices 716 and 718. Specifically, controller 722 causes switching devices 932 and 936 to operate in their respective off-states when switching devices 716 and 718 operate in their respective off-states, and controller 722 causes switching devices 932 and 936 to operate in their respective on-states when switching devices 716 and 718 operate in their respective on-states. Accordingly, controller 722 causes switching devices 932 and 936 to operate in their respective off-states when electrical output stage 902 is in its on-state, and controller 722 causes switching devices 932 and 936 to operate in their on-states when electrical output stage 902 is in its off-state. FIG. 9 illustrates electrical output stage 902 operating in its on-state, and switching devices 932 and 936 are therefore in their respective off-states. Consequently, reverse bias circuitry 920 is in its disabled operating state and does not affect operation of electrical output stage 902, in the illustration of FIG. 9.

Figure 10:
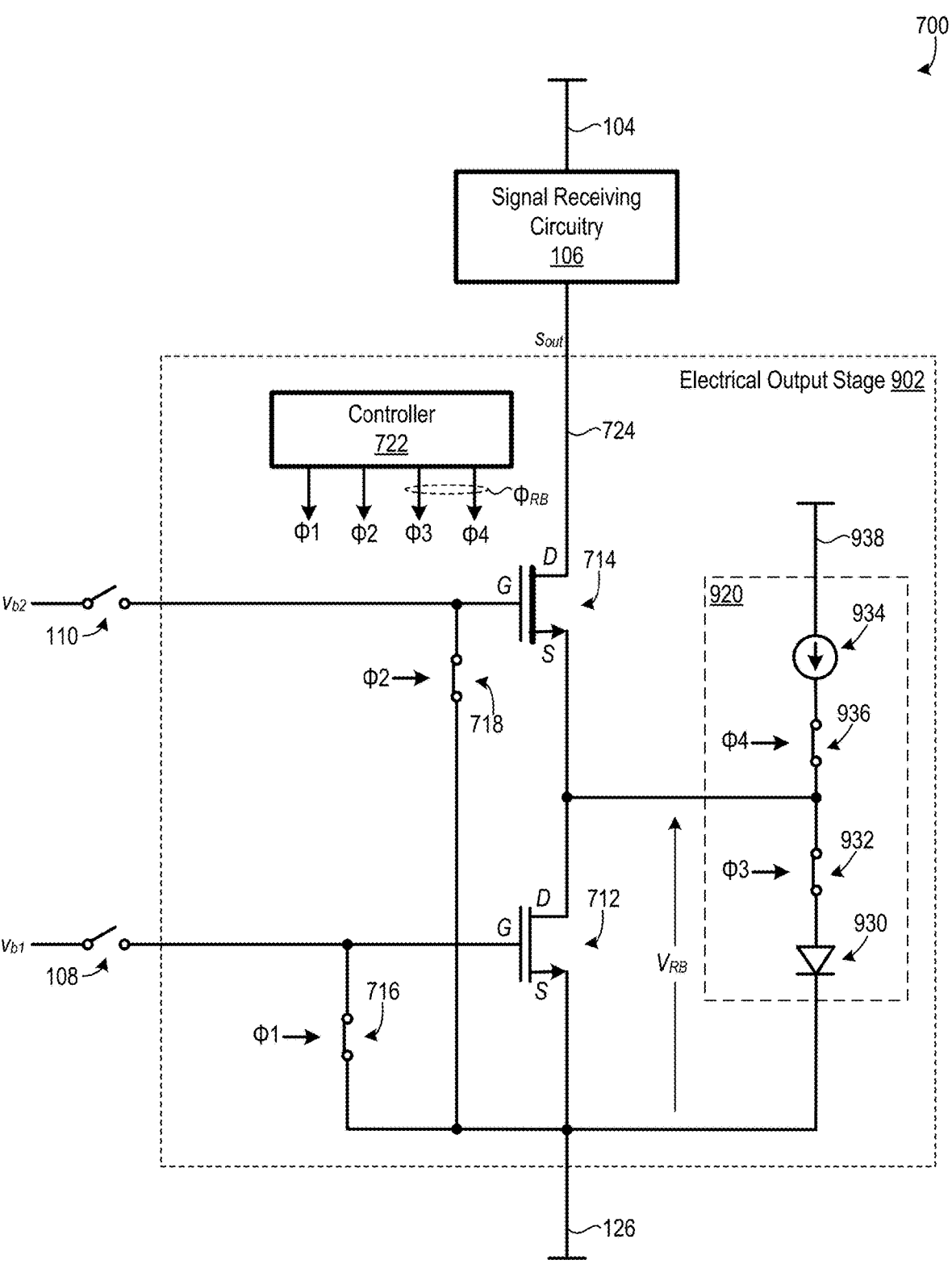
FIG. 10 is a schematic diagram of the FIG. 7 electrical environment including the FIG. 9 electrical output stage operating in its off-state.

FIG. 10 illustrates electrical output stage 902 operating in its off-state. Accordingly, each of switching devices 932 and 936 is in its on-state. As such, current source 934 pushes an electric current though diode 930, which serves as a voltage-drop device and exhibits a diode voltage drop, such as between 0.6 volt to 0.7 volt. Consequently, magnitude of voltage $V_{RB}$ is equal to voltage across diode 930, and gate-to-source voltage of second MOSFET 714 is approximately negative 0.6 volt to 0.7 volt when electrical output stage 902 is in its off-state, thereby helping minimize magnitude of leakage current flowing through second MOSFET 714.

Figure 11:
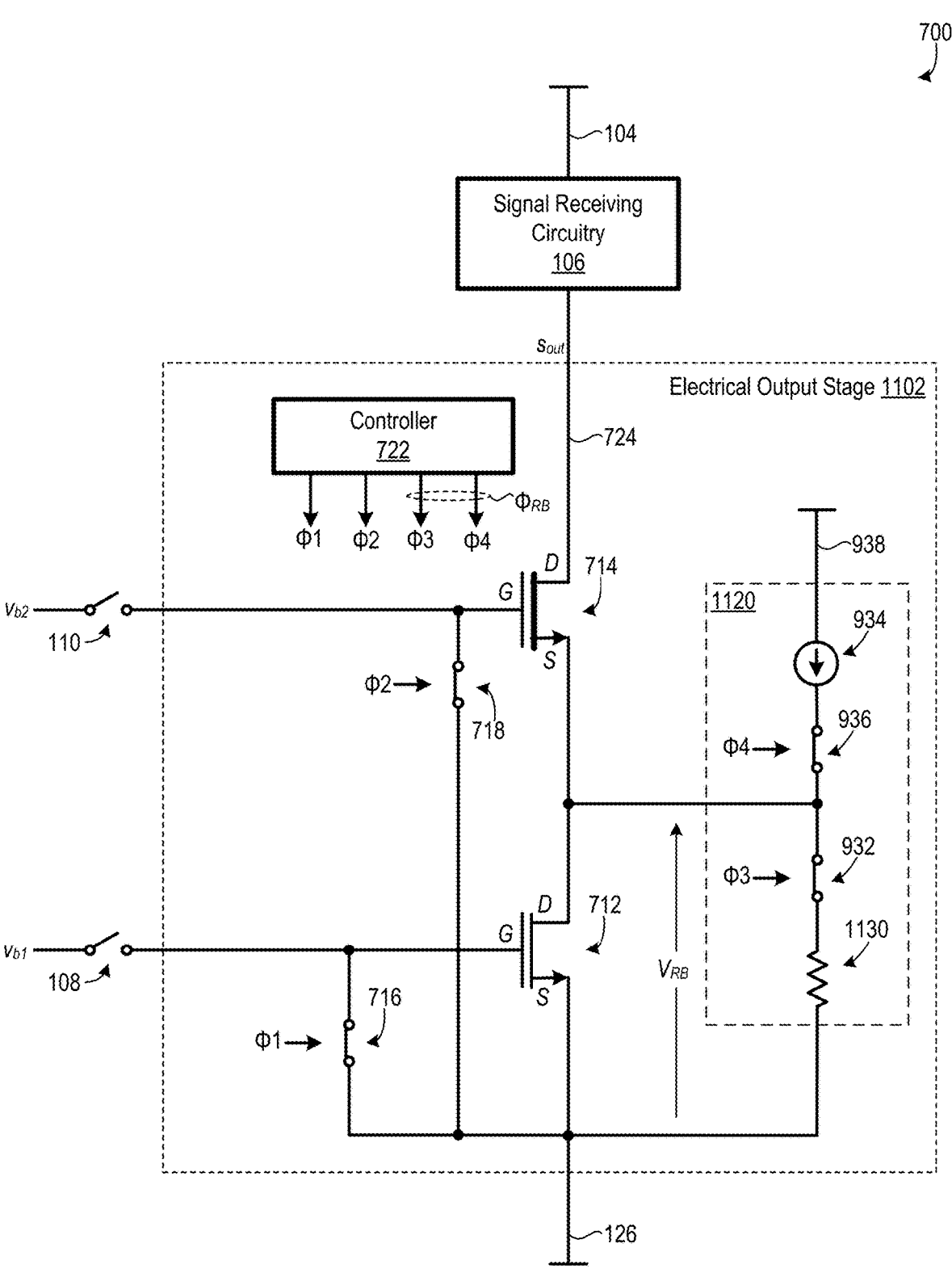
FIG. 11 is a schematic diagram of the FIG. 7 electrical environment illustrating details of another example embodiment of the electrical output stage, where the electrical output stage includes a resistor configured as a voltage-drop device.

Modifications to reverse bias circuitry 920 are possible. For example, the respective topological locations of diode 930 and switching device 932 could be swapped. As another example, diode 930 could be replaced with another type of voltage-drop device, such as a resistor, transistor, etc., that exhibits a voltage drop in response to current from current source 934. For instance, FIG. 11 is a schematic diagram of electrical environment 700 including an electrical output stage 1102, which is embodiment of electrical output stage 702 including reverse bias circuitry 1120. Reverse bias circuitry 1120 is another embodiment of reverse bias circuitry 720 (FIG. 7), and reverse bias circuitry 1120 differs from reverse bias circuitry 920 (FIG. 9) in that diode 930 is replaced with a resistor 1130. FIG. 11 illustrates electrical output stage 1102 operating in its off-state, and switching devices 932 and 936 are accordingly in their respective on-states. Consequently, current source 934 pushes an electric current through resistor 1130, thereby creating a voltage drop across resistor 1130. Therefore, magnitude of voltage $V_{RB}$ is equal to a product of (i) resistance of resistor 1130 and (ii) magnitude of electric current pushed through resistor 1130 by current source 934. Operation of electrical output stage 1102 in its on-state is not illustrated herein, but it is understood that controller 722 causes each switching device 716, 718, 932, and 936 to operate in its respective off-state when electrical output stage 1102 operates in its on-state.

Figure 12:
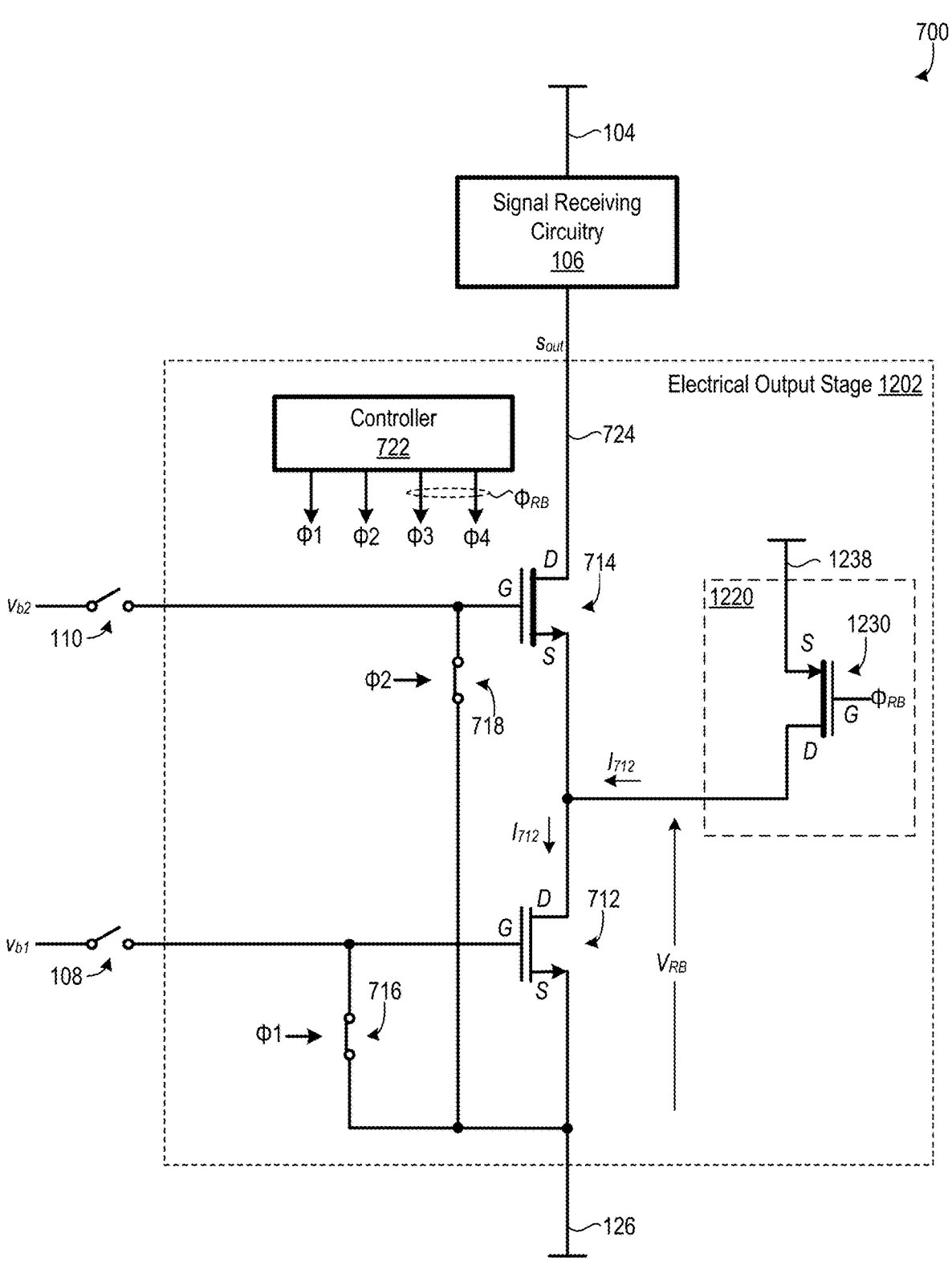
FIG. 12 is a schematic diagram of the FIG. 7 electrical environment illustrating details of another example embodiment of the electrical output stage, where the electrical output stage includes a transistor configured to provide a path for leakage current.

Referring again to FIGS. 7 and 8, reverse bias circuitry 720 could also be configured to provide a path for leakage current flowing through first MOSFET 712 when electrical output stage 702 is operating in its off-state, to generate voltage $V_{RB}$ between source S of second MOSFET 714 and power rail 126. For example, FIG. 12 is a schematic diagram of electrical environment 700 where electrical output stage 702 is embodied by an electrical output stage 1202 including reverse bias circuitry 1220. Reverse bias circuitry 1220 is another possible embodiment of reverse bias circuitry 720 of FIG. 7. Reverse bias circuitry 1220 includes a P-channel MOSFET 1230 where (i) a drain D of MOSFET 1230 is electrically coupled to source S of second MOSFET 714, a source S of MOSFET 1230 is electrically coupled to an additional electrical node 1238, and a gate G of MOSFET 1230 is controlled by control signal $\phi_{RB}$ generated by controller 722. Additional electrical node 1238 is, for example, power rail 104 or another power rail. Voltage of additional electrical node 1238 is greater than voltage $V_{126}$ of power rail 126. FIG. 12 illustrates electrical output stage 1202 operating in its off-state, and controller 722 generates control signal $\phi_{RB}$ when electrical output stage 1202 in its off-state in a manner which causes MOSFET 1230 to operate in its on-state. Consequently, MOSFET 1230 provides a path for leakage current $I_{712}$ flowing through first MOSFET 712, and magnitude of voltage $V_{RB}$ is equal to a product of (i) off-state resistance of first MOSFET 712 and (ii) magnitude of leakage current $I_{712}$. Operation of electrical output stage 1202 in its on-state is not illustrated herein, but it is understood that controller 722 generates control signal $\phi_{RB}$ to cause MOSFET 1230 to operate in its off-state when electrical output stage 1202 is in its on-state. MOSFET 1230 could be replaced with another type of transistor, or with a switching device other than a transistor. For example, MOSFET 1230 could be replaced with an N-channel MOSFET if controller 722 is configured to provide a positive gate-to-source voltage for controlling the N-channel MOSFET.

Figure 13:
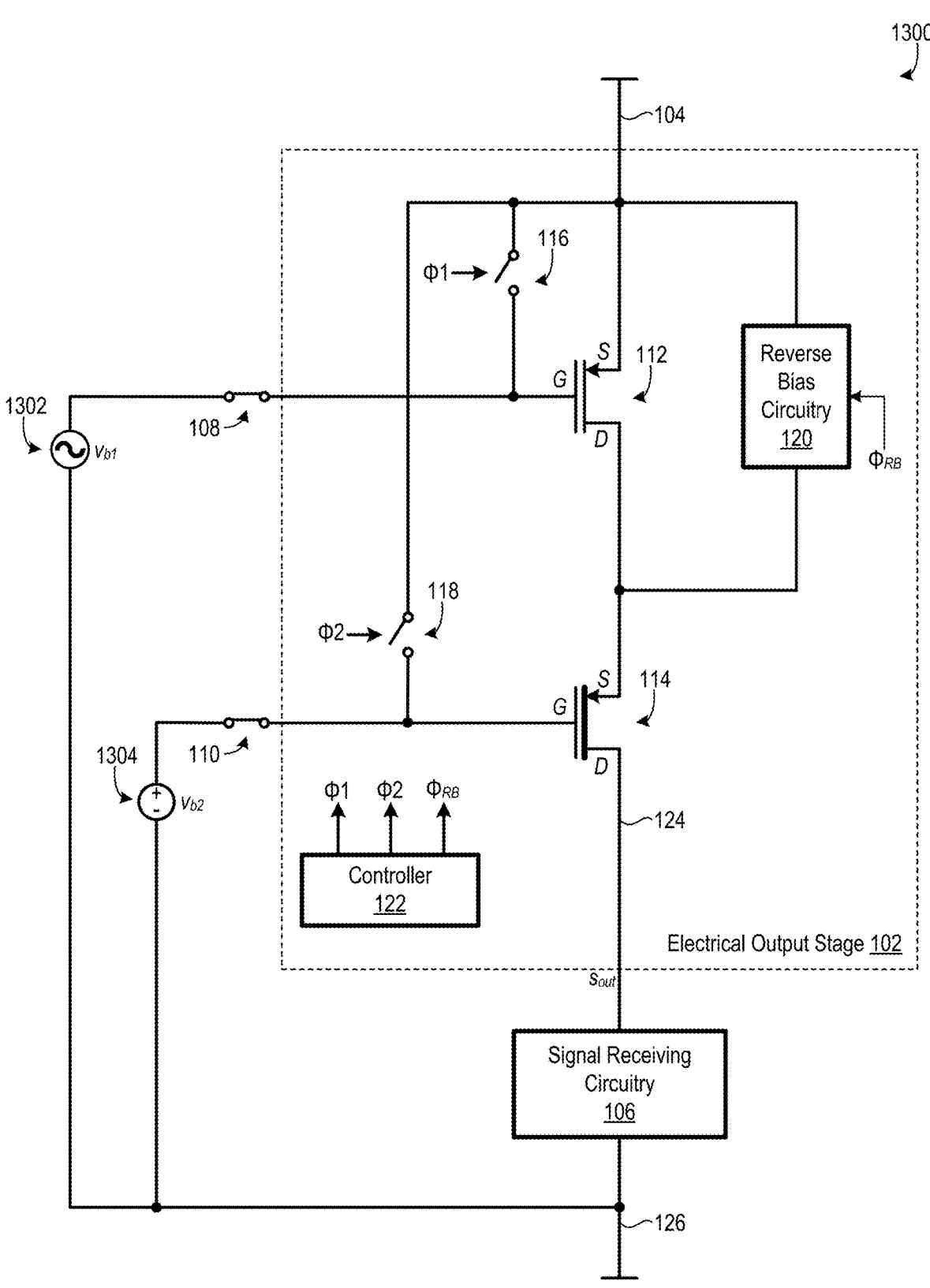
FIG. 13 is a schematic diagram of an embodiment of the FIG. 1 electrical environment further including a signal source and a voltage source.
Figure 14:
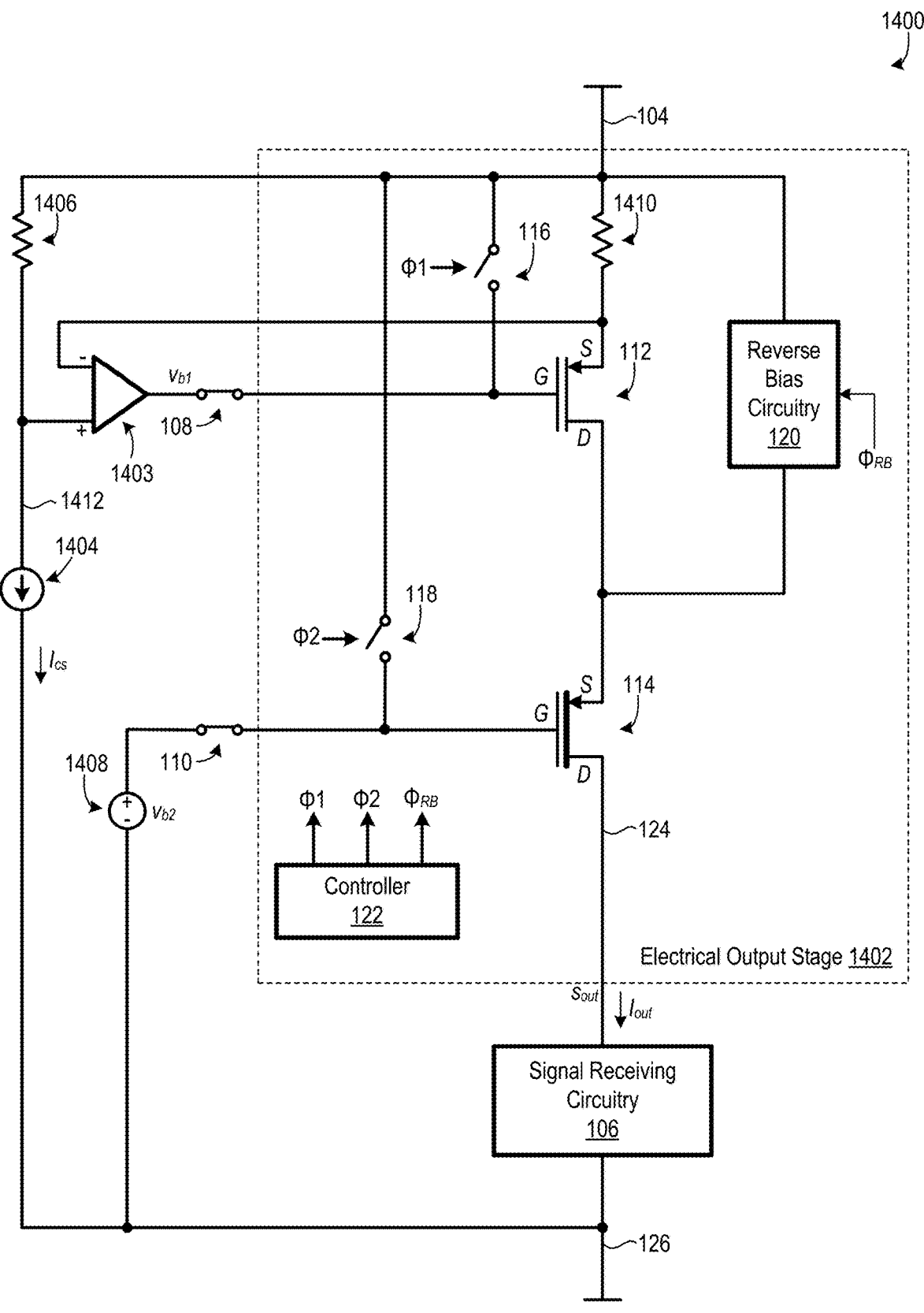
FIG. 14 is a schematic diagram of an embodiment of the FIG. 1 electrical environment including elements such that electrical environment forms a current multiplier.

Disclosed below with respect to FIGS. 13 and 14 are two respective example applications of the new electrical output stages disclosed herein. It is understood, though, that the new electrical output stages are not limited to the example applications of FIGS. 13 and 14. Additionally, while FIGS. 13 and 14 are discussed with respect to electrical output stage 102, it is understood that the examples of FIGS. 13 and 14 could be adapted to the other electrical output stages disclosed herein.

FIG. 13 is a schematic diagram of an electrical environment 1300 which is an embodiment of electrical environment 100 (FIG. 1) further including a signal source 1302 and a voltage source 1304. Signal source 1302 is configured to provide first bias signal $v_{b1}$ in the form of a signal to gate G of first MOSFET 112 for amplifying, level-shifting, and/or buffering, by electrical output stage 102. Voltage source 1304 is configured to provide second bias signal $v_{b2}$ in the form of a voltage having a relatively low magnitude, e.g., 5 volts, such that second MOSFET 114 continuously operates in its on-state when switching device 110 is in its on-state.

FIG. 14 is schematic diagram of an electrical environment 1400, which is an embodiment of electrical environment 100 (FIG. 1) further including an amplifier 1403, a current source 1404, a resistor 1406, and a voltage source 1408. Additionally, electrical output stage 102 of electrical environment 100 is replaced by an electrical output stage 1402, where electrical output stage 1402 is an alternate embodiment of electrical output stage 102. Electrical output stage 1402 differs from electrical output stage 102 in that electrical output stage 1402 further includes a resistor 1410 electrically coupled between source S of first MOSFET 112 and power rail 104. As such, source S of first MOSFET 112 is electrically coupled to power rail 104 via resistor 1410.

Resistor 1406 and current source 1404 are electrically coupled in series between power rail 104 and power rail 126. A non-inverting input of amplifier 1403 is electrically coupled to a node 1412 joining resistor 1406 and current source 1404. An inverting input of amplifier 1403 is electrically coupled to source S of first MOSFET 112. An output of amplifier 1403 provides first bias signal $v_{b1}$. Voltage source 1408 is configured to provide second bias signal $v_{b2}$ in the form of a voltage having a relatively low magnitude, e.g., 5 volts, such that second MOSFET 114 continuously operates in its on-state when switching device 110 is in its on-state. The elements of electrical environment 1400 collectively form a current multiplier which amplifies electric current $I_{cs}$ flowing through current source 1404 to obtain an output current $I_{out}$ flowing from output node 124 to signal receiving circuitry 106. A relationship between $I_{cs}$ and $I_{out}$ is given by EQN. 1 below, and gain G is defined by EQN. 2 below, where $R_{1406}$ is resistance of resistor 1406 and $R_{1410}$ is resistance of resistor 1410.

$$I_{out} = G \cdot I_{cs} \qquad \text{(EQN. 1)}$$

$$G = \frac{R_{1406}}{R_{1410}} \qquad \text{(EQN. 2)}$$

Combinations of Features

Features described above may be combined in various ways without departing from the scope hereof. The following examples illustrate some possible combinations.

(A1) An electrical output stage suitable for high-voltage operation includes (1) a first enhancement mode, metal oxide semiconductor field effect transistor (first MOSFET) and a second enhancement mode, metal oxide semiconductor field effect transistor (second MOSFET) electrically coupled in series between a power rail and an output node, (2) a first switching device configured to control a gate-to-source voltage of the first MOSFET, to enable the first MOSFET to be switched between a respective on-state and a respective off-state, (3) a second switching device configured to control a gate-to-source voltage of the second MOSFET, to enable the second MOSFET to be switched between a respective on-state and a respective off-state, and (4) reverse bias circuitry configured to bias a source of the second MOSFET such that a gate of the second MOSFET is reversed biased with respect to the source of the second MOSFET, when each of the first MOSFET and the second MOSFET is in its respective off-state.

(A2) In the electrical output stage denoted as (A1), (1) each of the first MOSFET and the second MOSFET may be a respective P-channel MOSFET, (2) a source of the first MOSFET may be electrically coupled to the power rail, (3) a drain of the first MOSFET may be electrically coupled to a source of the second MOSFET, and (4) a drain of the second MOSFET may be electrically coupled to the output node.

(A3) In the electrical output stage denoted as (A2), (1) the first switching device may be electrically coupled between a gate of the first MOSFET and the power rail, and (2) the second switching device may be electrically coupled between the gate of the second MOSFET and the power rail.

(A4) In either one of the electrical output stages denoted as (A2) and (A3), the reverse bias circuitry may be configured to bias the source of the second MOSFET such that the gate of the second MOSFET is reversed biased with respect to the source of the second MOSFET by causing a voltage at the source of the second MOSFET to be less than a voltage at the gate of the second MOSFET, when the second MOSFET is in its respective off-state.

(A5) In any one of the electrical output stages denoted as (A2) through (A4), the reverse bias circuitry may include (1) a voltage-drop device and a third switching device electrically coupled in series between the power rail and the source of the second MOSFET and (2) a current source and a fourth switching device electrically coupled in series between the source of the second MOSFET and an additional electrical node.

(A6) In the electrical output stage denoted as (A5), (1) the first switching device may be electrically coupled between a gate of the first MOSFET and the power rail, (2) the second switching device may be electrically coupled between the gate of the second MOSFET and the power rail, and (3) the electrical output stage may further include a controller configured to (i) cause each of the third switching device and the fourth switching device to operate in its respective on-state when each of the first switching device and the second switching device operates in its respective on-state and (ii) cause each of the third switching device and the fourth switching device to operate in its respective off-state when each of the first switching device and the second switching device operates in its respective off-state.

(A7) In any one of the electrical output stages denoted as (A1) through (A6), a source-to-drain voltage rating of the second MOSFET may be greater than a source-to-drain voltage rating of the first MOSFET.

(A8) In the electrical output stage denoted as (A1), (1) each of the first MOSFET and the second MOSFET may be a respective N-channel MOSFET, (2) a source of the first MOSFET may be electrically coupled to the power rail, (3) a drain of the first MOSFET may be electrically coupled to a source of the second MOSFET, and (4) a drain of the second MOSFET may be electrically coupled to the output node.

(A9) In the electrical output stage denoted as (A8), (1) the first switching device may be electrically coupled between a gate of the first MOSFET and the power rail, and (2) the second switching device may be electrically coupled between the gate of the second MOSFET and the power rail.

(A10) In either one of the electrical output stages denoted as (A8) or (A9), the reverse bias circuitry may be configured to reverse bias the source of the second MOSFET such that the gate of the second MOSFET is reversed biased with respect to the source of the second MOSFET by causing a voltage at the source of the second MOSFET to be greater than a voltage at the gate of the second MOSFET, when the second MOSFET is in its respective off-state.

(A11) In any one of the electrical output stages denoted as (A8) through (A10), the reverse bias circuitry may include (1) a voltage-drop device and a third switching device electrically coupled in series between the source of the second MOSFET and the power rail and (2) a current source and a fourth switching device electrically coupled in series between an additional electrical node and the source of the second MOSFET.

(A12) In the electrical output stage denoted as (A11), (1) the first switching device may be electrically coupled between a gate of the first MOSFET and the power rail, (2) the second switching device may be electrically coupled between the gate of the second MOSFET and the power rail, and (3) the electrical output stage may further include a controller configured to (i) cause each of the third switching device and the fourth switching device to operate in its respective on-state when each of the first switching device and the second switching device operates in its respective on-state and (ii) cause each of the third switching device and the fourth switching device to operate in its respective off-state when each of the first switching device and the second switching device operates in its respective off-state.

(A13) In any one of the electrical output stages denoted as (A8) through (A12), a drain-to-source voltage rating of the second MOSFET may be greater than a drain-to-source voltage rating of the first MOSFET.

(A14) In any one of the electrical output stages denoted as (A1) through (A13), a gate of the first MOSFET may be configured to receive an input signal for at least one of (i) amplification of the input signal by the electrical output stage, (ii) level-shifting of the input signal by the electrical output stage, and (iii) buffering of the input signal by electrical output stage.

(A15) In any one of the electrical output stages denoted as (A1) through (A4), (A7) through (A10), (A13), and (A14), the reverse bias circuitry may include a transistor configured to provide a path for leakage current flowing through the first MOSFET.

(B1) An electrical output stage suitable for high-voltage operation includes (1) a first enhancement mode, P-channel metal oxide semiconductor field effect transistor (first MOSFET) including a first drain, a first source, and a first gate, the first source being electrically coupled to a power rail, (2) second enhancement mode, P-channel metal oxide semiconductor field effect transistor (second MOSFET) including a second drain, a second source, and a second gate, the second source being electrically coupled to the first drain, and the second drain being electrically coupled to an output node of the electrical output stage, (3) a first switching device electrically coupled between the first gate and the power rail, (4) a second switching device electrically coupled between the second gate and the power rail, (5) a voltage-drop device and a third switching device electrically coupled in series between the power rail and the second source, and (6) a current source and a fourth switching device electrically coupled in series between the second source and an additional electrical node, the current source being configured to pull electric current through the voltage-drop device such that a gate-to-source voltage of the second MOSFET is positive in an off-state of the electrical output stage.

(B2) The electrical output stage denoted as (B1) may further include a controller configured to (1) cause each of the first switching device, the second switching device, the third switching device, and the fourth switching device to operate in a respective off-state, in an on-state of the electrical output stage, and (2) cause each of the first switching device, the second switching device, the third switching device, and the fourth switching device to operate in a respective on-state, in an off-state of the electrical output stage.

(B3) In either one of the electrical output stages denoted as (B1) and (B2), a source-to-drain voltage rating of the second MOSFET may be greater than a source-to-drain voltage rating of the first MOSFET.

(C1) An electrical output stage suitable for high-voltage operation includes (1) a first enhancement mode, N-channel metal oxide semiconductor field effect transistor (first MOSFET) including a first drain, a first source, and a first gate, the first source being electrically coupled to a power rail, (2) second enhancement mode, N-channel metal oxide semiconductor field effect transistor (second MOSFET) including a second drain, a second source, and a second gate, the second source being electrically coupled to the first drain, and the second drain being electrically coupled to an output node of the electrical output stage, (3) a first switching device electrically coupled between the first gate and the power rail, (4) a second switching device electrically coupled between the second gate and the power rail, (5) a voltage-drop device and a third switching device electrically coupled in series between the power rail and the second source, and (6) a current source and a fourth switching device electrically coupled in series between the second source and an additional electrical node, the current source being configured to push electric current through the voltage-drop device such that a gate-to-source voltage of the second MOSFET is negative in an off-state of the electrical output stage.

(C2) The electrical output stage denoted as (C1) may further include a controller configured to (1) cause each of the first switching device, the second switching device, the third switching device, and the fourth switching device to operate in a respective off-state, in an on-state of the electrical output stage and (2) cause each of the first switching device, the second switching device, the third switching device, and the fourth switching device to operate in a respective on-state, in an off-state of the electrical output stage.

Changes may be made in the above methods, devices, and systems without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which as a matter of language, might be said to fall therebetween.

What is claimed is:

1. An electrical output stage suitable for high-voltage operation, the electrical output stage comprising:

a first enhancement mode, metal oxide semiconductor field effect transistor (first MOSFET) and a second enhancement mode, metal oxide semiconductor field effect transistor (second MOSFET) electrically coupled in series between a power rail and an output node;

a first switching device configured to control a gate-to-source voltage of the first MOSFET, to enable the first MOSFET to be switched between a respective on-state and a respective off-state;

a second switching device configured to control a gate-to-source voltage of the second MOSFET, to enable the second MOSFET to be switched between a respective on-state and a respective off-state; and reverse bias circuitry configured to bias a source of the second MOSFET such that a gate of the second MOS- FET is reversed biased with respect to the source of the second MOSFET, when each of the first MOSFET and the second MOSFET is in its respective off-state.

2. The electrical output stage of claim 1, wherein:

each of the first MOSFET and the second MOSFET is a respective P-channel MOSFET;

a source of the first MOSFET is electrically coupled to the power rail;

a drain of the first MOSFET is electrically coupled to a source of the second MOSFET; and a drain of the second MOSFET is electrically coupled to the output node.

3. The electrical output stage of claim 2, wherein:

the first switching device is electrically coupled between a gate of the first MOSFET and the power rail; and the second switching device is electrically coupled between the gate of the second MOSFET and the power rail.

4. The electrical output stage of claim 2, wherein the reverse bias circuitry is configured to bias the source of the second MOSFET such that the gate of the second MOSFET is reversed biased with respect to the source of the second MOSFET by causing a voltage at the source of the second MOSFET to be less than a voltage at the gate of the second MOSFET, when the second MOSFET is in its respective off-state.

5. The electrical output stage of claim 2, wherein the reverse bias circuitry comprises:

a voltage-drop device and a third switching device electrically coupled in series between the power rail and the source of the second MOSFET; and a current source and a fourth switching device electrically coupled in series between the source of the second MOSFET and an additional electrical node.

6. The electrical output stage of claim 5, wherein:

the first switching device is electrically coupled between a gate of the first MOSFET and the power rail;

the second switching device is electrically coupled between the gate of the second MOSFET and the power rail; and the electrical output stage further comprises a controller configured to:

cause each of the third switching device and the fourth switching device to operate in its respective on-state when each of the first switching device and the second switching device operates in its respective on-state, and cause each of the third switching device and the fourth switching device to operate in its respective off-state when each of the first switching device and the second switching device operates in its respective off-state.

7. The electrical output stage of claim 2, wherein a source-to-drain voltage rating of the second MOSFET is greater than a source-to-drain voltage rating of the first MOSFET.

8. The electrical output stage of claim 1, wherein:

each of the first MOSFET and the second MOSFET is a respective N-channel MOSFET;

a source of the first MOSFET is electrically coupled to the power rail;

a drain of the first MOSFET is electrically coupled to a source of the second MOSFET; and a drain of the second MOSFET is electrically coupled to the output node.

9. The electrical output stage of claim 8, wherein:

the first switching device is electrically coupled between a gate of the first MOSFET and the power rail; and the second switching device is electrically coupled between the gate of the second MOSFET and the power rail.

10. The electrical output stage of claim 8, wherein the reverse bias circuitry is configured to reverse bias the source of the second MOSFET such that the gate of the second MOSFET is reversed biased with respect to the source of the second MOSFET by causing a voltage at the source of the second MOSFET to be greater than a voltage at the gate of the second MOSFET, when the second MOSFET is in its respective off-state.

11. The electrical output stage of claim 8, wherein the reverse bias circuitry comprises:

a voltage-drop device and a third switching device electrically coupled in series between the source of the second MOSFET and the power rail; and a current source and a fourth switching device electrically coupled in series between an additional electrical node and the source of the second MOSFET.

12. The electrical output stage of claim 11, wherein:

the first switching device is electrically coupled between a gate of the first MOSFET and the power rail;

the second switching device is electrically coupled between the gate of the second MOSFET and the power rail; and the electrical output stage further comprises a controller configured to:

cause each of the third switching device and the fourth switching device to operate in its respective on-state when each of the first switching device and the second switching device operates in its respective on-state, and cause each of the third switching device and the fourth switching device to operate in its respective off-state when each of the first switching device and the second switching device operates in its respective off-state.

13. The electrical output stage of claim 8, wherein a drain-to-source voltage rating of the second MOSFET is greater than a drain-to-source voltage rating of the first MOSFET.

14. The electrical output stage of claim 1, wherein a gate of the first MOSFET is configured to receive an input signal for at least one of (i) amplification of the input signal by the electrical output stage, (ii) level-shifting of the input signal by the electrical output stage, and (iii) buffering of the input signal by electrical output stage.

15. The electrical output stage of claim 1, wherein the reverse bias circuitry comprises a transistor configured to provide a path for leakage current flowing through the first MOSFET.

16. An electrical output stage suitable for high-voltage operation, the electrical output stage comprising:

a first enhancement mode, P-channel metal oxide semiconductor field effect transistor (first MOSFET) including a first drain, a first source, and a first gate, the first source being electrically coupled to a power rail;

second enhancement mode, P-channel metal oxide semiconductor field effect transistor (second MOSFET) including a second drain, a second source, and a second gate, the second source being electrically coupled to the first drain, and the second drain being electrically coupled to an output node of the electrical output stage;

a first switching device electrically coupled between the first gate and the power rail;

a second switching device electrically coupled between
the second gate and the power rail;
a voltage-drop device and a third switching device elec-
trically coupled in series between the power rail and the
second source; and
a current source and a fourth switching device electrically
coupled in series between the second source and an
additional electrical node, the current source being
configured to pull electric current through the voltage-
drop device such that a gate-to-source voltage of the
second MOSFET is positive in an off-state of the
electrical output stage.
17. The electrical output stage of claim 16, further com-
prising a controller configured to:
cause each of the first switching device, the second
switching device, the third switching device, and the
fourth switching device to operate in a respective
off-state, in an on-state of the electrical output stage;
and
cause each of the first switching device, the second
switching device, the third switching device, and the
fourth switching device to operate in a respective
on-state, in an off-state of the electrical output stage.
18. The electrical output stage of claim 16, wherein a
source-to-drain voltage rating of the second MOSFET is
greater than a source-to-drain voltage rating of the first
MOSFET.
19. An electrical output stage suitable for high-voltage
operation, the electrical output stage comprising:
a first enhancement mode, N-channel metal oxide semi-
conductor field effect transistor (first MOSFET) includ-
ing a first drain, a first source, and a first gate, the first
source being electrically coupled to a power rail;

second enhancement mode, N-channel metal oxide semi-
conductor field effect transistor (second MOSFET)
including a second drain, a second source, and a second
gate, the second source being electrically coupled to the
first drain, and the second drain being electrically
coupled to an output node of the electrical output stage;
a first switching device electrically coupled between the
first gate and the power rail;
a second switching device electrically coupled between
the second gate and the power rail;
a voltage-drop device and a third switching device elec-
trically coupled in series between the power rail and the
second source; and
a current source and a fourth switching device electrically
coupled in series between the second source and an
additional electrical node, the current source being
configured to push electric current through the voltage-
drop device such that a gate-to-source voltage of the
second MOSFET is negative in an off-state of the
electrical output stage.
20. The electrical output stage of claim 19, further com-
prising a controller configured to:
cause each of the first switching device, the second
switching device, the third switching device, and the
fourth switching device to operate in a respective
off-state, in an on-state of the electrical output stage;
and
cause each of the first switching device, the second
switching device, the third switching device, and the
fourth switching device to operate in a respective
on-state, in an off-state of the electrical output stage.

* * * * *